United States Patent [19]
Moriyasu

[11] Patent Number: 5,243,343
[45] Date of Patent: Sep. 7, 1993

[54] SIGNAL ACQUISITION SYSTEM UTILIZING ULTRA-WIDE TIME RANGE TIME BASE

[75] Inventor: Hiro Moriyasu, Portland, Oreg.

[73] Assignee: Zeelan Technology, Inc., Beaverton, Oreg.

[21] Appl. No.: 621,620

[22] Filed: Dec. 3, 1990

[51] Int. Cl.⁵ ................. H03M 1/00; G01R 23/16
[52] U.S. Cl. ................. 341/123; 328/151; 328/13; 328/28; 324/102; 324/76 R
[58] Field of Search .......... 341/61, 155, 118, 123, 341/122; 328/151, 13, 28; 324/77 R, 102

[56] References Cited

U.S. PATENT DOCUMENTS

| | | | |
|---|---|---|---|
| 3,456,189 | 7/1969 | Hornak | 324/121 R |
| 3,473,123 | 10/1969 | Hornak | 324/121 R |
| 3,659,086 | 4/1972 | Metcalf | 328/151 |
| 3,713,029 | 1/1973 | Uchida | 328/151 |
| 3,753,133 | 8/1973 | Shumate, Jr. | 341/123 X |
| 3,937,943 | 2/1976 | Debrunner et al. | 235/183 |
| 4,142,146 | 2/1979 | Schumann et al. | 341/123 X |
| 4,297,680 | 10/1981 | Koeman | 341/123 |
| 4,626,827 | 12/1986 | Kitamura et al. | |
| 4,755,951 | 7/1988 | Hollister | |
| 4,791,404 | 12/1988 | Hollister | 341/122 |
| 4,841,497 | 6/1989 | Bateman et al. | 341/120 |

*Primary Examiner*—Sharon D. Logan
*Attorney, Agent, or Firm*—Dellett, Smith-Hill and Walters

[57] ABSTRACT

A signal acquisition system using an ultra-wide time range digitizer with variable time interval data sampling and data storage includes signal conditioning and sampling stages, a digitizing stage for generating digital representations of a signal, and a memory for storing the digital representations. Timing circuitry controls sampling and digitizing which may be varied so as to acquire signals on linear, logarithmic, or other time bases. Signal compression may be obtained by digitizing information only when a desired change rate is observed. A display allows acquired signals to be displayed in linear, logarithmic or other manner.

19 Claims, 19 Drawing Sheets

SIGNAL ACQUISITION SYSTEM UTILIZING ULTRA-WIDE TIME RANGE TIME BASE

BACKGROUND OF THE INVENTION

In electronic design, many circuits, components and systems must be tested and data from such tests must be documented, stored and later retrieved for comparison with other data or analyzed by computer means. Conventional data acquisition by digitizing the electrical signals allows data to be stored in computer readable form; however, any sample rate selected for capture limits the range of data to (sample interval) * (record length). Any information outside the selected time window cannot be reconstructed at a later time. Because of this constraint, careful planning of the test setup is required. Alternatively, data may be captured from multiple test setups to cover a wider time range.

These test setups are cumbersome yet cannot guarantee sufficient data for accurate comparison or processing at a future date. Many attempts, such as delayed sweep, delayed trigger, logic trigger and increasing record length have been made to minimize this problem. Increasing data size allows extension of the time window, but always a memory size limitation remains, thereby limiting the time window.

Conventional data capture can cause further difficulties if the data is to be compared with data from computer simulation of electronic circuits. Such simulation can readily simulate electronic circuit behavior over a time range from picoseconds to seconds. For example, if a conventional data acquisition system were to be used to capture data over a one second time interval with time resolution of 10 picoseconds, 100 billion data samples would be required. This, obviously, would require too much data memory, and therefore one would be restricted to either limited time resolution or a limited time window or both. Also, since typical record lengths are 1,000 to 10,000 samples, multiple data acquisition cycles and multiple records are required to capture even a moderate time window with fine time resolution. It would be desirable to provide a data acquisition system that captures data over wide time intervals with fine time resolution.

SUMMARY OF THE INVENTION

A preferred embodiment of the present invention comprises a time range digitizer which samples, digitizes, stores and processes data over an ultra-wide time range (picoseconds to seconds). Data compression and display of such data over any time range is possible while maintaining fine time resolution. The digitizer samples data in a prescribed manner with varying time bases, and may also process signals to provide signal amplitude compression. Flexible display of acquired signals is possible, allowing linear and logarithmic displays in combination over various time spans.

An object of this invention is to provide a system for digitizing, storing, displaying, comparing, and processing of an ultra-wise time range of captured information.

Yet another object of this invention is to display an ultra-wide time range of data in a single contiguous display.

A further object of this invention is to enable the retrieval of captured signals and display of said signals at any time base setting, with improved display resolution.

Yet another object of this invention is to provide for compression of captured data to reduce storage requirements and storage and retrieval times.

Yet another object of this invention is to enable display and comparison for signals which may otherwise have been captured with different time base settings.

Yet another object of this invention is to provide display, comparison, and mathematical manipulation of captured signals with computer generated simulation waveforms without concern for matching of data time range.

Yet another object of this invention is to provide capture of data before the trigger event and over an ultra-wide time range after the trigger event.

Yet another object of this invention is to provide two ultra-wide range time bases to be combined for operation together in a delaying-delayed mode.

Yet another object of this invention is to provide two combined time bases, one of the said time bases being a conventional time base and the other time base to be an ultra-wide time range time base, operating together in a delaying-delayed mode.

The subject matter of the present invention is particularly pointed out and distinctly claimed in the concluding portion of this specification. However, both the organization and method of operation, together with further advantages and objects thereof, may best be understood by reference to the following description taken in connection with accompanying drawings wherein like reference characters refer to like elements.

DRAWINGS

DETAILED DESCRIPTION

Figure 1:
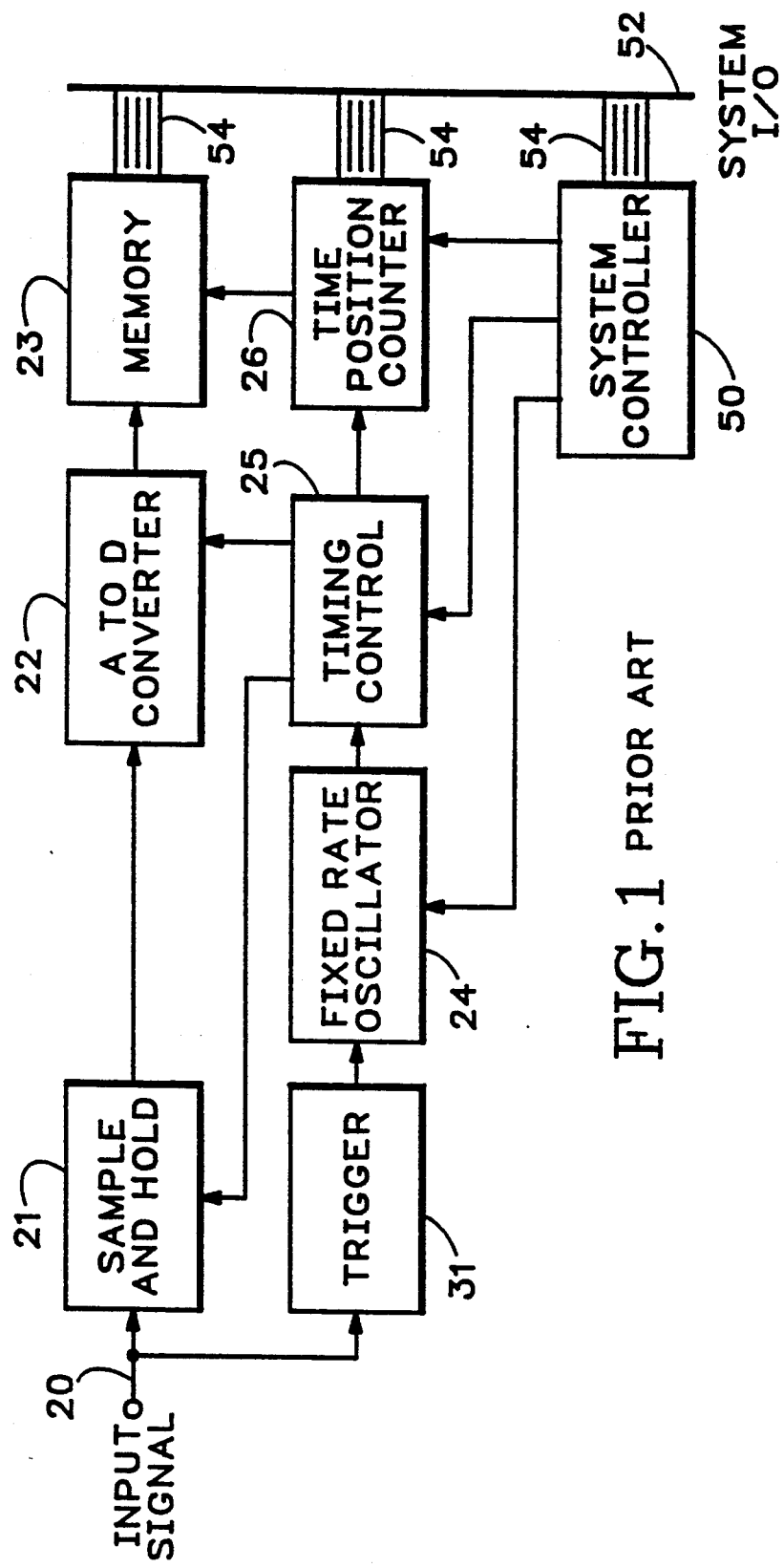
FIG. 1 is a block diagram of a conventional real-time digitizer.

Referring to FIG. 1, a block diagram of a conventional real-time sequential signal digitizer, an input signal 20 is provided to sample and hold circuit 21 wherein a sample of the input signal is held to be conveyed to analog to digital converter block 22. Memory 23 receives the output of A to D converter 22. Input signal 20 is also provided to a trigger block 31 and the output thereof is received by fixed rate oscillator block 24. The output of the fixed rate oscillator is an input for timing control block 25 and the output of timing control block 25 is conveyed as input to sample and hold circuit 21 and A to D converter 22, as well as to time position counter block 26 which provides an input to memory 23. Output from system controller block 50 is received by fixed rate oscillator 24, timing control 25 and time position counter 26. Memory 23, time position counter 26 and system controller 50 are all in communication with data bus 52 via bus connectors 54.

In operation, the appearance of input signal 20 at trigger block 31 will start the sampling process. The output of the trigger controls the operation of the fixed rate oscillator which produces a uniformly time spaced sampling pulse to the timing control block 25 for controlling the sampling rate. The timing control block output provides a clocking signal as conveyed to sample and hold circuit 21 and A to D converter 22 to ensure that the A to D conversion does not commence until the sample and hold operation is complete. The timing control block operates as a multiple delay device, delaying each of its outputs to the sample and hold, A to D and time position counter by varying amounts. Thus, the sample and hold will be pulsed first, instructing it to receive and hold a signal sample. Next, after a time delay sufficient to allow the sampling operation to be completed, the timing control will convey a pulse to the A to D converter, thereby instructing the converter to generate a digital representation of the sample. Then, after another delay, the timing control will send a pulse to the time position counter, which functions as a memory address counter, such that the counter is instructed to increment the address at which the digital representation from the A to D converter is stored. The timing control signal to the counter also causes the counter to enable the memory for storage, whereby the digital representation from the A to D converter is stored in memory at the address provided. The amount of delay between pulses provided to the various blocks is dependent upon the speed of operation of the circuitry within the sample and hold and A to D converter. In any case, the sample, convert and store process is continuously repeated in concert with the clocking signal from the fixed rate oscillator. It will be appreciated that the total sample size acquired in operation is limited by the amount of storage available in memory 23.

Figure 2:
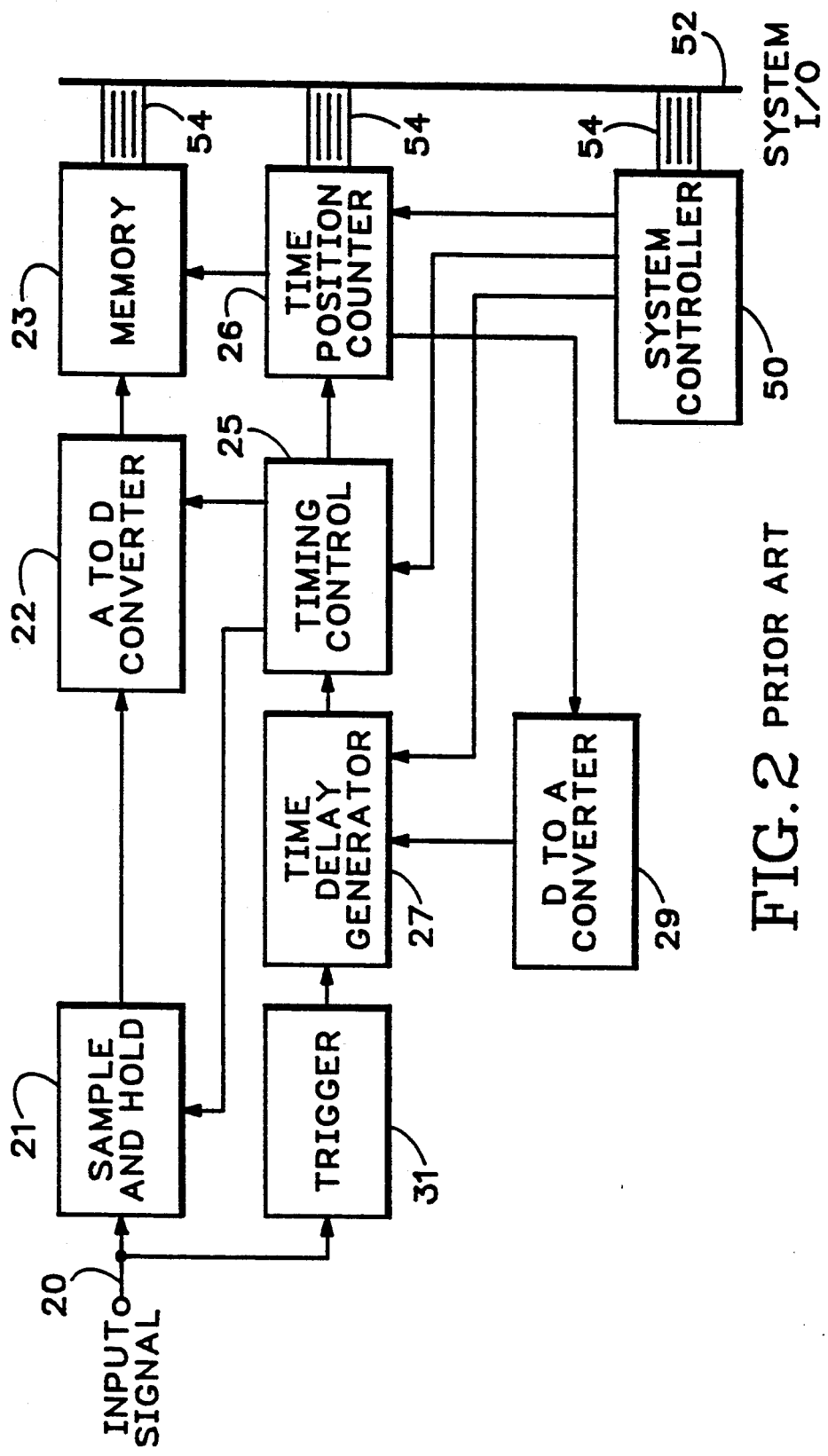
FIG. 2 is a block diagram of a conventional equivalent time sampling digitizer for repetitive signals.

FIG. 2 is a block diagram of a conventional equivalent time sampling digitizer for repetitive signals. The device is similar to the device of FIG. 1 but the fixed rate oscillator is replaced by time delay generator 27 and D to A converter 29. The time delay generator receives trigger 31 output for generating an output applied to timing control block 25, and also receives input from D to A converter 29. The D to A converter is provided with an input from time position counter 26. Input signal 20 operates the trigger coupled to time delay generator 27. At the end of a predetermined time delay, a single sample pulse is provided at the output of the time delay generator and fed to timing control 25 causing the system to sample and hold the input signal and perform an A to D conversion, storing the result thereof in memory 23 as addressed by time position counter 26. Digital data from the time position counter is also fed back to D to A converter 29, the value increasing as data samples are taken. The digital value is converted to an analog signal before being provided as an input to the time delay generator. As the repetitive signal occurs, the trigger will again provide input to the time delay generator, but the time delay generator will delay by an increasing period of time on subsequent sampling cycles, in response to the increasing signal value from the D to A converter. The increased delay may be accomplished by employing a ramp generator and a comparator, wherein the trigger signal from trigger 31 initiates operation of the ramp and the ramp output is compared with an input signal from the D to A converter. As the D to A converter signal increases with subsequent samples, the amount of delay time increases since the ramp must reach a greater value before the comparator indicates that the two signals are equal. When the trigger is coherent with a repetitive waveform, the net result is that successive points along the waveform are measured at successive repetitions of the waveform since the amount of delay between the trigger event and the sampling operation is increasing. An equivalent time sampling digitizer can capture high speed waveforms.

Both types of conventional digitizing systems tend to capture data on evenly spaced time intervals wherein the time window over which data is captured is equal to (sample interval) * (record length). To extend the time window without losing time resolution requires extending the record length and, as a result, large time windows with fine time resolution require data records so large as to be impractical.

Figure 3:
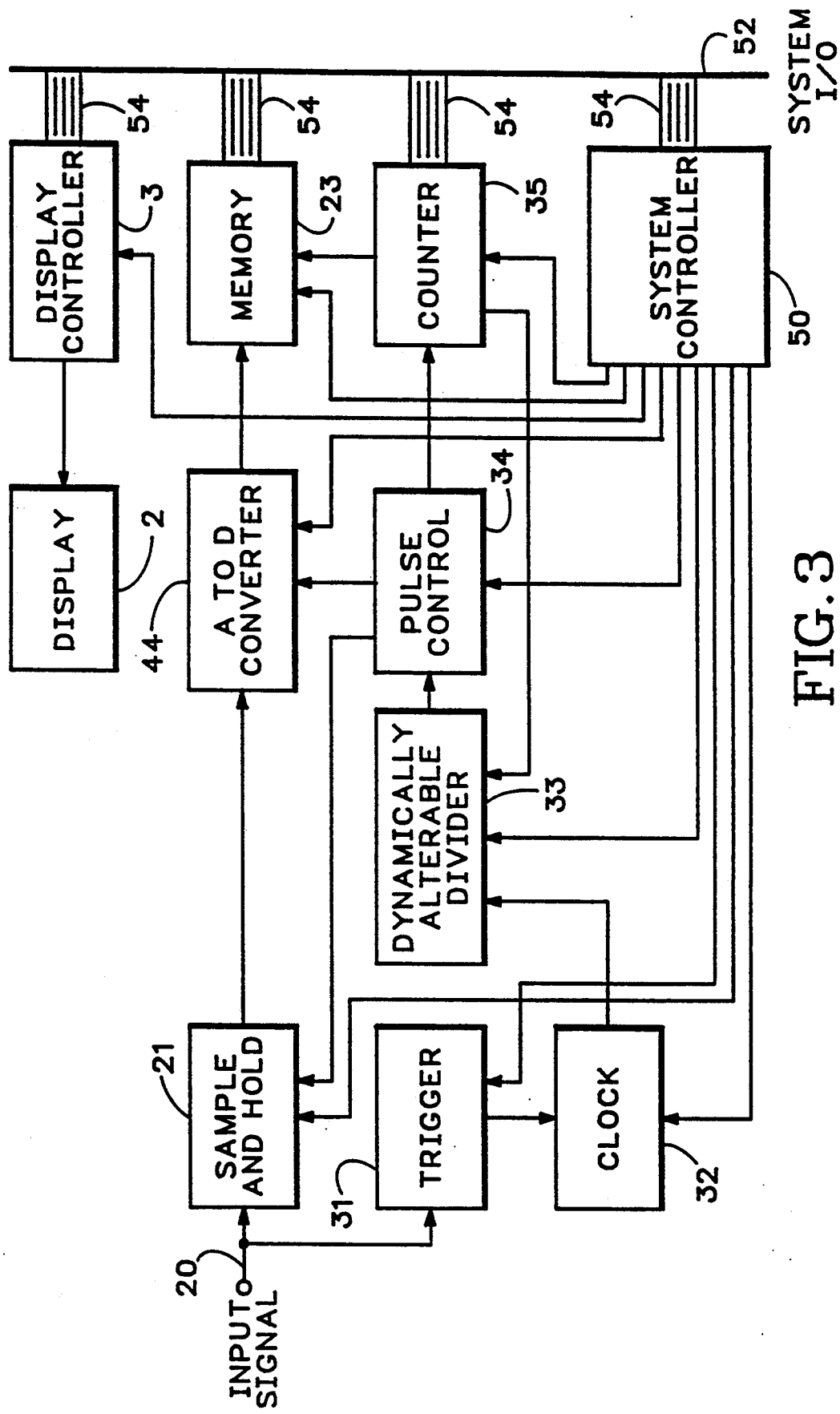
FIG. 3 is a block diagram of an ultra-wide time range digitizing system according to the present invention.

Referring to FIG. 3, comprising a block diagram of an ultra-wide time range digitizing system according to the present invention, incoming signal 20 is captured through conventional means, i.e., via sample and hold circuit 21, analog to digital converter 44 and data memory 23. Trigger block 31 receives the input signal and supplies an input to clock 32, the latter having its output coupled to dynamically alterable divider 33. Counter 35 supplies an additional input for alterable divider 33 and addresses memory 23. Output from the dynamically alterable divider supplies the input to pulse control block 34 which controls sample and hold circuit 21, A to D converter 44 and counter 35. The system further includes a display 2 receiving a signal from display controller 3 and displaying the digitized waveform.

Display controller 3, memory 23, counter 35 and system controller 50 are in communication with system bus 52 via connectors 54.

In operation, input signal 20 initiates operation of trigger circuit 31 which starts clock generator 32 whereupon an output thereof is conveyed to dynamically alterable divider 33. The dynamically alterable divider can change the sampling period depending on the relationship between the signal trigger point and the count from counter 35. The divider 66 functions as a comparator, comparing the number of clock signals with the counter 35 value and generating a sampling pulse when the clock count equals the signal from counter 35. As the counter 35 signal increases (indicative of an increased number of samples taken and stored in memory), the dynamically alterable divider can be made responsive to increasingly higher clock counts. Thus, an increasing period of time can be provided between successive samples.

When the divider 33 determines that a sample should be taken, the output of the divider initiates operation of pulse control 34, and control 34 then operates sample and hold circuit 21 to sample the input signal 20. Once the sample is obtained, pulse control 34 allows A to D converter 44 to convert the sampled signal to digital form. Pulse control 34 also enables counter 35 after sufficient delay for A to D conversion to be completed. Once so enabled, the counter asserts an address to memory 23 causing the digital signal to be stored. Once the converted signal is stored in memory 23 as addressed by counter 35, the counter increments the storage address so that subsequently acquired data will be stored at different memory addresses.

Figure 14:
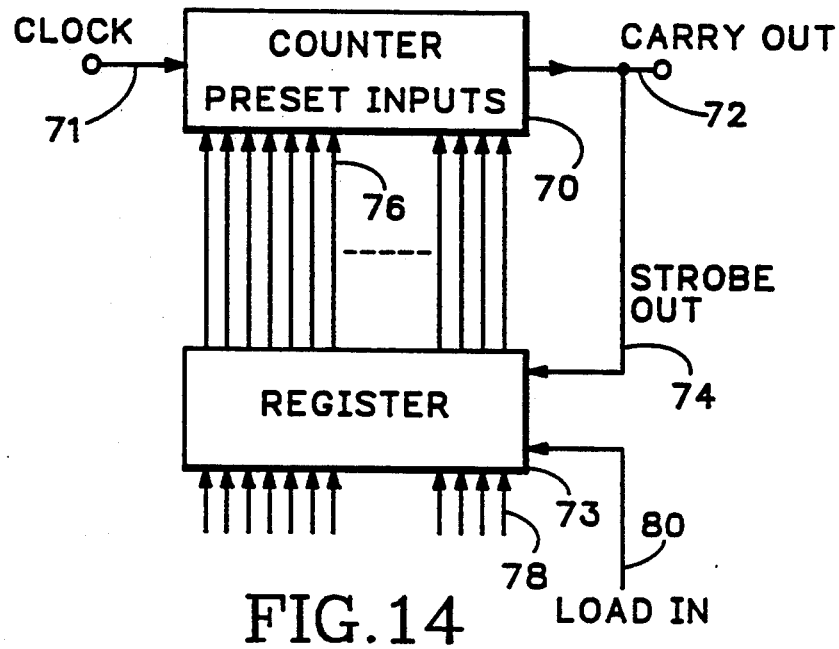
FIG. 14 is more detailed block diagram of an embodiment of the dynamically alterable divider of FIG. 3.

Referring now to FIG. 14, comprising a more detailed block diagram of dynamically alterable divider 33 of FIG. 3, the internal operation thereof will be described in greater detail. The divider includes counter 70 receiving a count value via lines 76 from register 73. Clock signal 71 is provided to the counter 70 (from clock 32 of FIG. 3) and each pulse from the clock will increment the counter so that when the count reaches zero, a carry out signal 72 appears. This signal comprises the output from dynamically alterable divider 33 conveyed to pulse control block 34 of FIG. 3. The carry out signal 72 is fed back as a strobe signal 74 to register 73, whereupon the count value stored in the register is loaded via lines 76 into the counter. The counting cycle will then begin again. Register 73 also receives a load signal 80 and new counter input value 78 which is set by counter 35 of FIG. 3. In operation, when the system controller asserts the load signal on line 80, the value on line 78 is loaded into register 73. Then, when the counter 70 reasserts the strobe signal, the newly stored value from the register will be loaded to the counter.

Figure 6A:
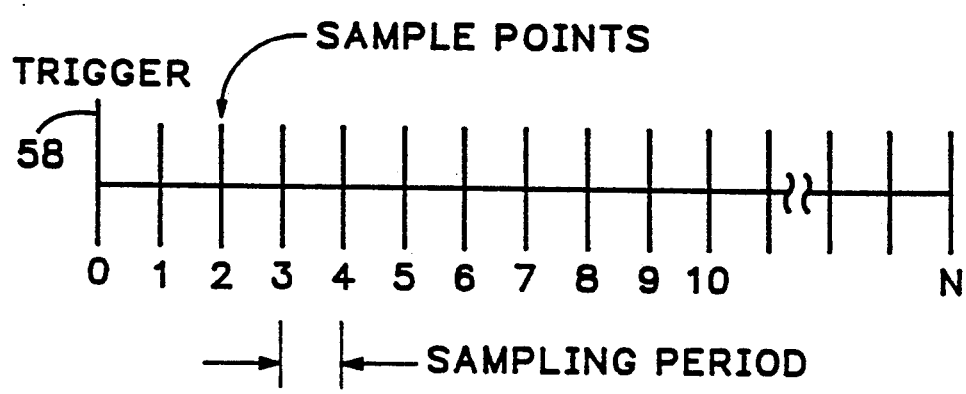
FIG. 6A is a graphic illustration of a conventional constant interval digitizing scheme.
Figure 6B:
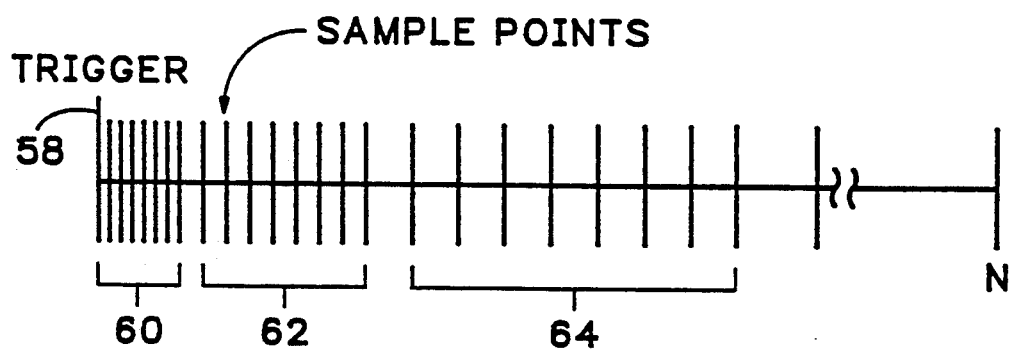
FIG. 6B is a graphic illustration of the ultra-wide time range digitizing system of the present invention.
Figure 7A:
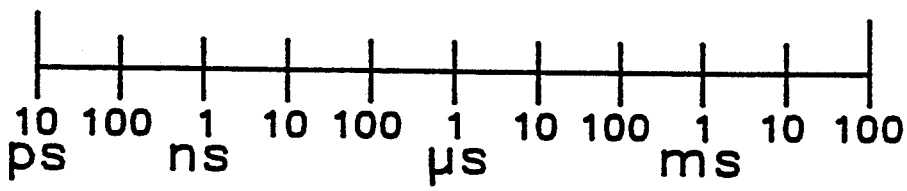
FIGS. 7A–7C are graphic illustrations of the ultra-wide time range display format according to the present invention, showing multiple decade displays.
Figure 7B:
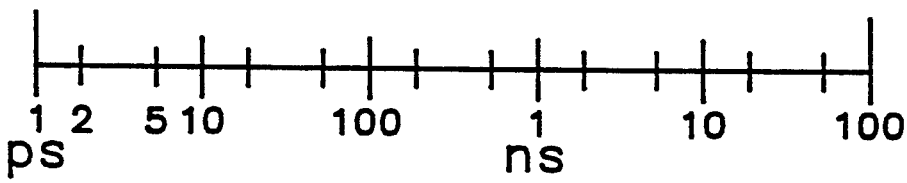
Figure 7C:
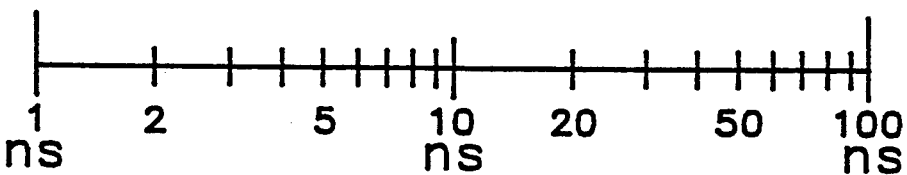
Figure 7D:
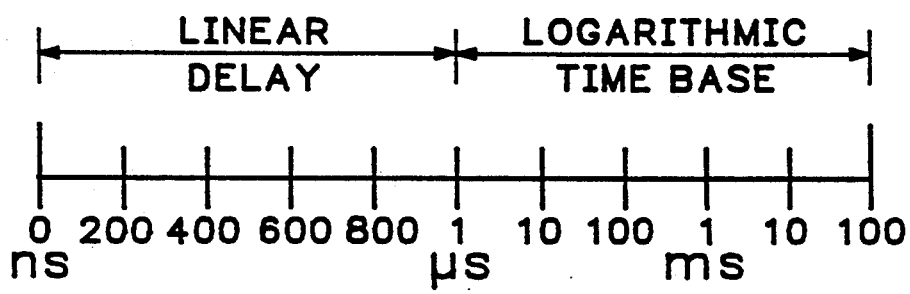
FIGS. 7D and 7E are graphic illustrations of linear/log delaying/delayed display formats of the present invention.
Figure 7E:
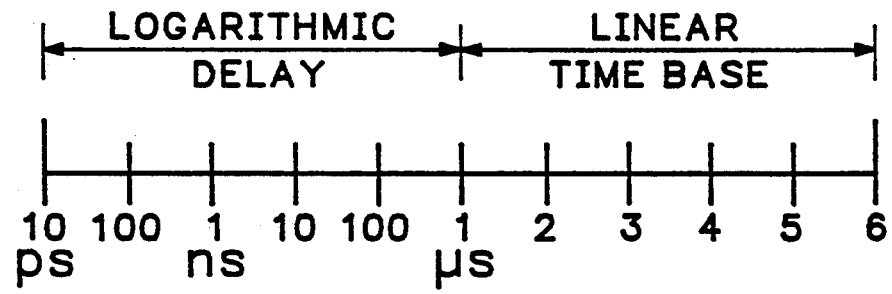

The operation of the dynamically alterable divider may be better understood in conjunction with FIG. 14 and FIGS. 6A and 6B. FIG. 6A illustrates the sampling of a conventional device. Trigger point 58 begins the sampling, and N sequential samples are taken, each sampling period being of equal length. FIG. 6B illustrates the variable sampling provided through the use of the dynamically alterable divider. Sampling begins at trigger 58 and a first group of samples 60 are taken with a first time delay between each sample. Once a desired number of samples are taken at the first time delay, the system controller asserts the load signal line 80, causing a new counter input value 78 to be loaded into register 73. Then, the next carry out signal 72 from the delay counter 70 will cause the new register value to be loaded into the counter 70. The new value loaded is larger than the previous value, and as such, the amount of delay between sample pulses is increased. Therefore, a number of samples within group 62 is taken with greater delay time between samples than the delay in group 60. After a predetermined number of samples are taken within group 62, a new delay value is loaded, resulting in another group 64 with a still greater delay time between each sample.

Within each sample group, the sampling periods of successive samples are typically equal (although the samples also may be spaced by any non-linear function such as log or square root). However, subsequent groups have different sampling periods. (In the illustrated case, the subsequent sampling periods are longer; however, when viewing events whose frequency increases with time, a faster sampling rate can be used in successive groups.) Successive time delay ranges can have lengths arranged in a particular sequence such as binary (1, 2, 4, 8, etc.) or the conventional 1, 2, 5, 10, etc.

Figure 18:
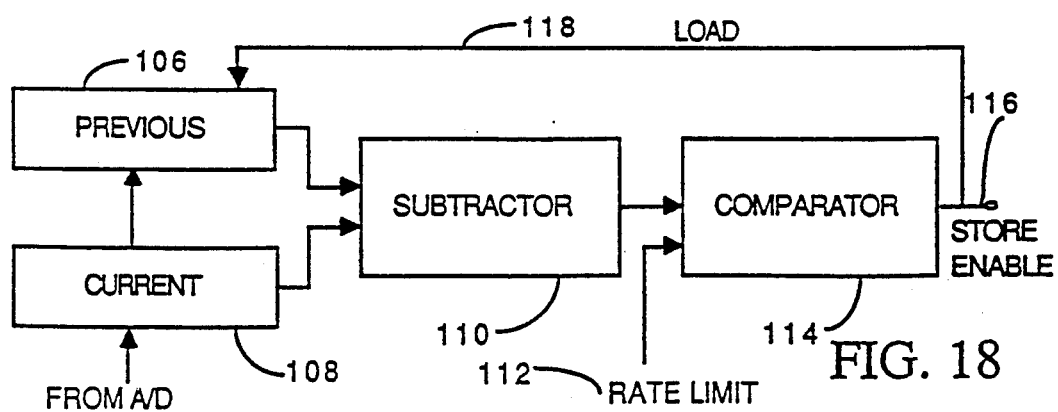
FIG. 18 is a block diagram of data value change detection portions of the A to D converter of the present invention.

A to D converter 44 may be provided with the ability to detect data value changes such that if an incoming signal is not changing at a rate above a selected threshold, no data value is stored in memory 23. FIG. 18 is a block diagram of circuitry to achieve data value change detection. The previous digitized data buffer 106 stores the data from the previous signal acquisition. Current data buffer 108 receives the current digitized value from the A to D conversion circuitry. Buffers 106 and 108 supply subtractor 110 and the output thereof as well as a rate limit signal 112 are inputs for comparator 114. Comparator 114 generates store enable 116 as an output, and this output is provided to previous buffer 106 as load signal 118.

In operation, the previous digitized data value is retained in buffer 106 and this retained value is then compared with the current digitized data value in buffer 108. If the comparator determines that the difference between the retained and the current data values (as computed by subtractor 110) is less than a rate limit value 112 supplied by the system controller, no data storage takes place. However, if the difference between the two values is greater than the threshold, comparator 114 generates a store enable signal 116 which enables memory 23 for storage while the retained previous digitized data value buffer 106 receives load signal 118 and is updated with the current digitized data value from buffer 108. Subsequent digitized values may then be compared against the newly updated retained value. This ability allows data compression, only storing data when a specific change in the measured value has occurred.

Figure 4:
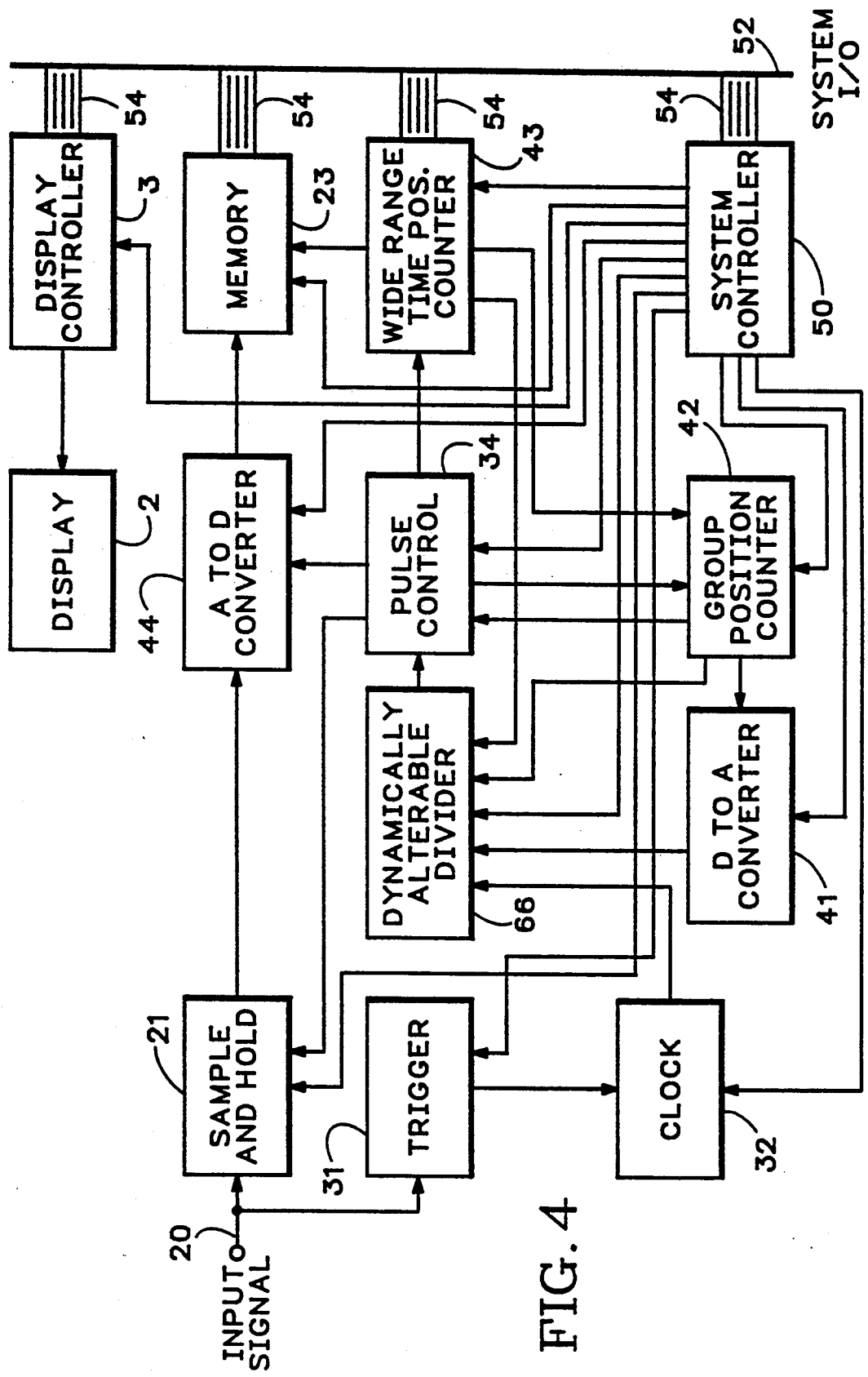
FIG. 4 is a block diagram of an ultra-wide range equivalent time sampling digitizer for repetitive signals according to the present invention.

FIG. 4 illustrates another embodiment of the present invention, an ultra-wide range equivalent time sampling digitizer for repetitive signals. The incoming signal is passed in a conventional manner through the sample and hold circuit 21 and analog to digital converter 44 to data memory 23. The embodiment of FIG. 4 is similar to that of FIG. 3, but counter 35 is replaced by several blocks and dynamically alterable divider 33 is replaced by a dynamically alterable divider 66 operative as described below in conjunction with FIG. 15. Wide range time position counter block 43 receives the output of pulse control 34, and is in communication with bus 52 via bus connector 54 while providing inputs to memory 23, dynamically alterable divider 66 and group position counter 42. Group position counter 42 also receives input from pulse control 34 and conveys a first output to D to A converter 41 and a second output to pulse control 34. The output of D to A converter 41 is provided to dynamically alterable divider 66.

The sampling process in FIG. 4 is started when input signal 20, as provided to the trigger generator 31, causes the trigger generator to initiate operation of the dynamically alterable divider 66 via clock 32. After the dynamically alterable divider delays the clock pulse for a first amount of time, a pulse is sent to pulse control 34. The pulse control then instructs the sample and hold circuit to take a sample of the input signal. After a delay to allow the sampling process to be completed, the pulse control will send a pulse to the A to D converter causing the sampled signal to be converted to digital form. Once the A to D conversion is finished, the pulse control supplies a signal to wide range time position counter 43, whereupon the wide range counter provides an address to memory 23 for storing the digitized data, and also causing the counter to increment the address for the next data to be stored. The pulse control also sends a pulse to the group position counter which will increment for keeping track of the number of samples taken at the current spacing between samples. Digital data from the group position counter is fed back to D to A converter 41. This value is suitably increased as more data samples are taken, with the digital value being converted to an analog signal to control the dynamically alterable divider. Increased delay may be accomplished by use of a ramp generator and a comparator, as will be discussed below in conjunction with FIG. 15. As the D to A converter signal increases, the delay time also increases since the ramp must reach a greater value before the comparator indicates the ramp and D to A signals are equal.

Figure 15:
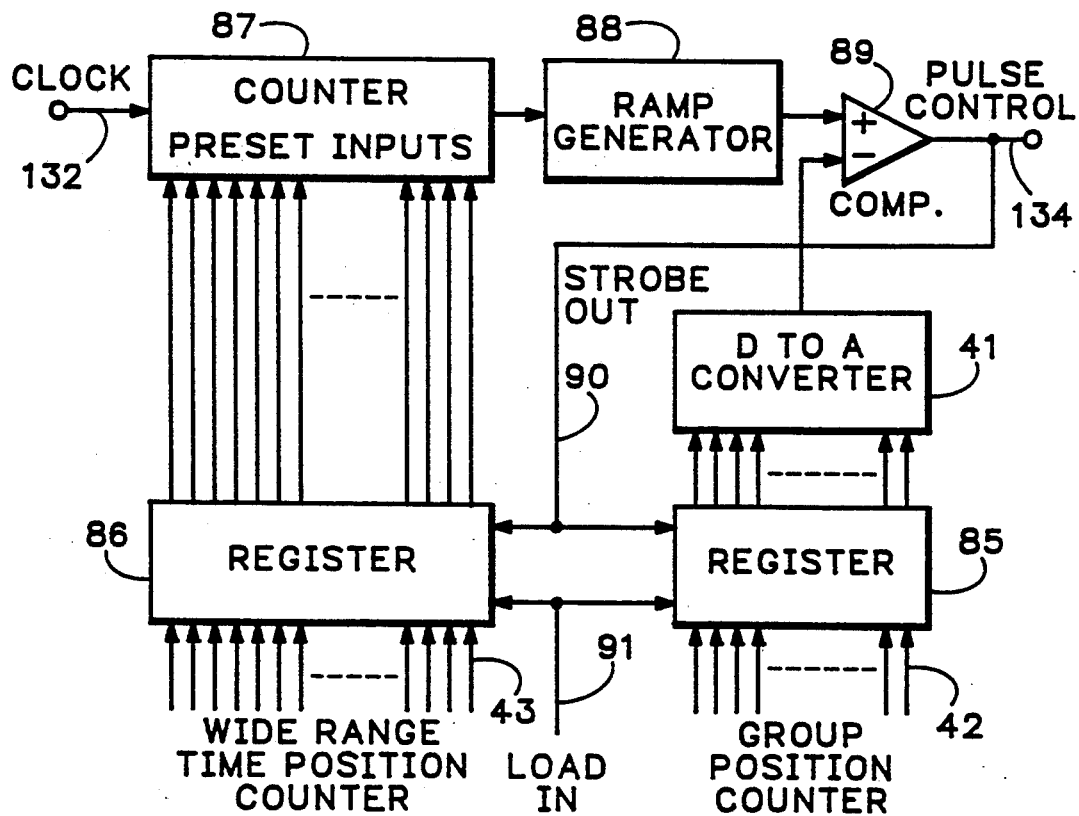
FIG. 15 is more detailed block diagram of an embodiment of the dynamically alterable divider of FIG. 4 and FIG. 5.

Referring to FIG. 15, comprising a more detailed block diagram of an embodiment of the dynamically alterable divider 66 and D to A converter 41 of FIG. 4, clock signal 132 is provided to counter 87 which also receives input values from register 86. The output of the counter feeds ramp generator 88 which supplies a signal to the "+" leg of comparator 89. The comparator "−" leg input is received from D to A converter 41. Comparator output 134 is the output of the dynamically alterable divider as coupled to pulse control 34 of FIG. 4 while also supplying the strobe out signal 90 to registers 85 and 86. Register 85 receives a signal from group position counter 42 and supplies D to A converter 41. Register 86 receives information from wide range time position counter 43. A load-in signal 91 is received by both register 85 and register 86.

In operation, each clock pulse 132 will increment the counter, and when the counter reaches zero, a carry out signal is coupled to ramp generator 88 for initiating a ramp signal sent to comparator 89. The comparator compares the ramp signal to the output of D to A converter 41, and when the ramp becomes greater than the value provided by the D to A converter, an output pulse is generated. This output is supplied to the pulse control block and also supplies strobe out 90 which causes register 86 to reload counter 87 whereupon the counting cycle begins again. The strobe out enables register 85 to reload the D to A converter. Load in signal 91, when asserted (e.g. by system controller 50), loads values into the registers 86 and 85. Register 85 receives the new value from group position counter 42, while register 86 receives its new value from wide range time position counter 43. The load in line allows the counter and converter inputs to be dynamically altered in effect by supplying new delay values to registers 85 and 86 from wide range time position counter 43 and group position counter 42, thereby allowing dynamic modification of the overall data acquisition system timing.

Referring to FIG. 15 and FIG. 4, a pulse control output is provided to the group position counter 42. Each pulse from the pulse control 34 increments a value within counter 42 and when this value reaches a value N, where N is equal to the number of samples desired at the current time period setting, the group position counter returns a pulse to the pulse control which signals the wide range time position counter 43 indicating that a new timer spacing value is to be provided for register 86, which sets a new value for the counter 87. Once the new value is loaded into the register 86, the spacing between samples will increase.

With the device of FIG. 4 operating as an ultra-wide range equivalent time sampling digitizer, the group position counter supplies successively larger values to register 85, resulting in a higher value being provided to D to A converter 41 and as a result, a higher value will be provided to the "−" leg of comparator 89. With this higher value on the comparator, the ramp generator 88 has to reach a higher value (and therefore, will require a greater time period) before the comparator generates an output pulse. As such, successive samples are taken at successive times along the repetitive waveform with successive triggers. After a number of samples are taken, the value N will be reached causing a new time delay value to be loaded into register 86.

Figure 5:
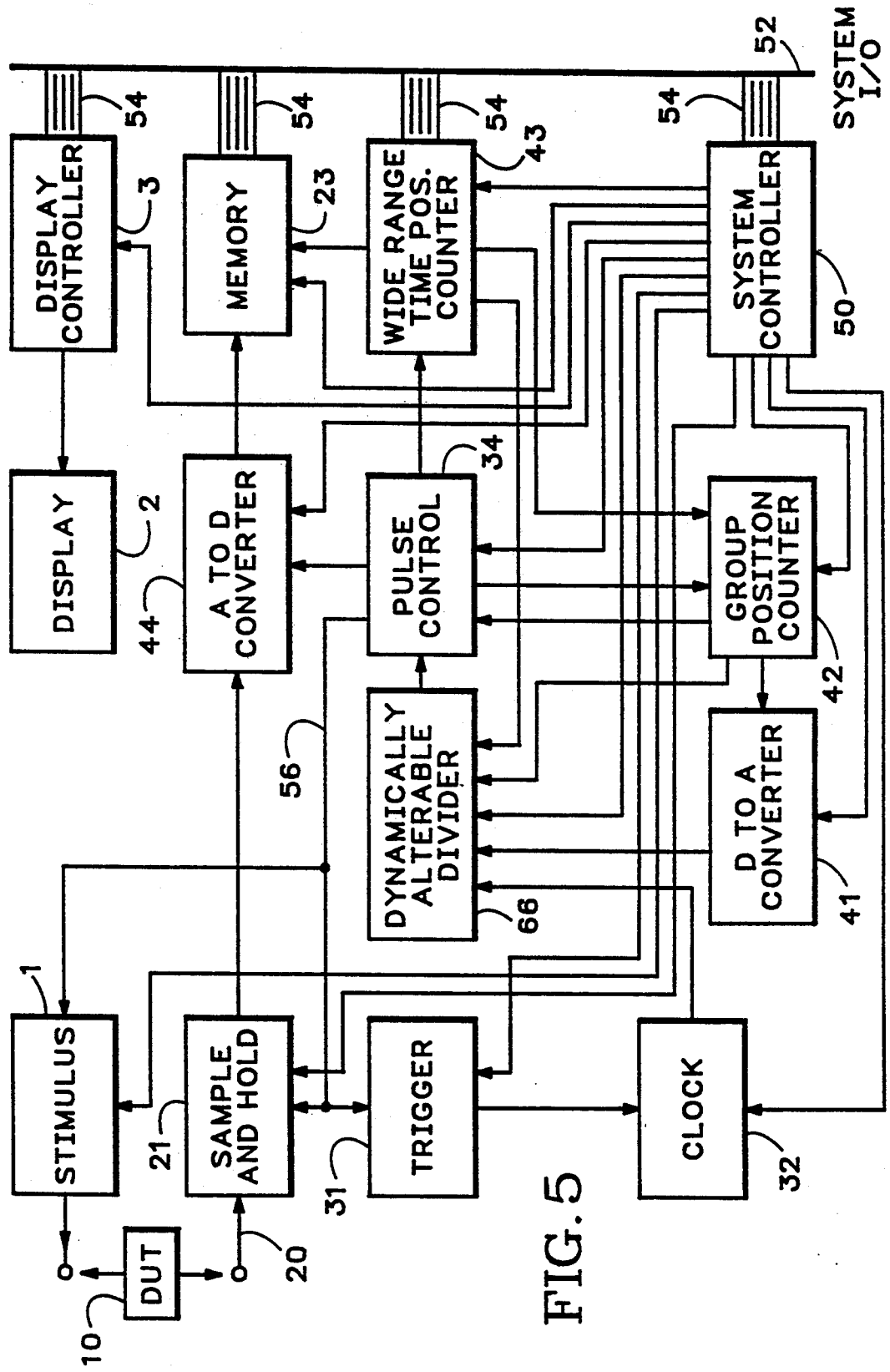
FIG. 5 is a block diagram of an ultra-wide time range stimulus-response digitizing system.

FIG. 5 is a block diagram illustrating an embodiment of a stimulus-response digitizing system according to the present invention. The embodiment of FIG. 5 corresponds to that of FIG. 4 with the addition of stimulus block 1 and a device under test (DUT) 10. Stimulus block 1 is adapted to receive an input from pulse control 34 on line 56 which also supplies control input to sample and hold circuit 21 and trigger block 31. The stimulus block output is applied to the device under test and the device under test generates a response output 20 for sample and hold circuit 21.

In operation, pulse control 34 initiates an output pulse on line 56 to begin circuit operation including that of the clock 32 which is coupled to the dynamically alterable divider 66. After a time delay sufficient to allow the sampling operation to be completed, the pulse control pulses the A to D converter to translate the analog sample from the DUT as taken by the sample and hold into a digital form. After sufficient delay, the pulse control sends a pulse to the wide range time position counter 43 whereupon the counter enables the memory for storage. Thus a stimulated response can be stored in memory 23.

In the embodiments of FIGS. 3, 4 and 5, the data for the signal being measured is stored as a pair of values comprising the value of the signal at the time of measurement (e.g. signal voltage) and the time at which the measurement is taken, time zero being the point at which the triggering event occurs. Alternatively, when the timing sequence of the sampling is known, only the signal measurements need be stored, and the time data may be derived from the position in memory of the stored data. Since the data is available as measurement values and time of measurement coordinate pairs, displaying the data comprises plotting time versus measurement values in various ways enabled by the data made available.

FIG. 7 illustrates an ultra-wide time range display format according to the present invention. FIG. 7A shows an ultra-wide time range display with 10 decades of time data, from 10 picoseconds to 100 milliseconds in a single display. FIG. 7B and FIG. 7C show how the display may be zoomed (expanded) or panned (horizontally scrolled). FIG. 7B illustrates a display of five decades while FIG. 7C illustrates a two decade display. As shown in FIG. 7D and FIG. 7E, data from a number of groups may be displayed linearly along the time axis, while data within other groups may be displayed along a logarithmically scaled time axis. FIG. 7D illustrates the format of a linear delay applied before the start of a logarithmic time base data acquisition and FIG. 7E illustrates the display format of logarithmic delay applied before the start of a linear time base data acquisition.

Figure 8A:
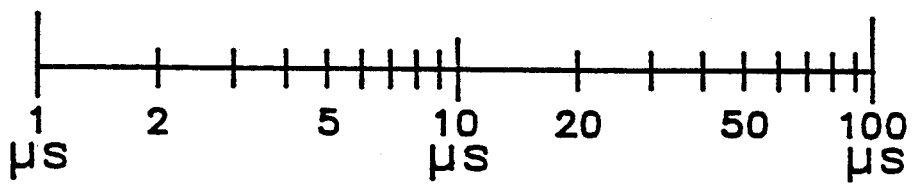
FIGS. 8A and 8B are graphic illustrations of a further expansion of the ultra-wide time range display.
Figure 8B:
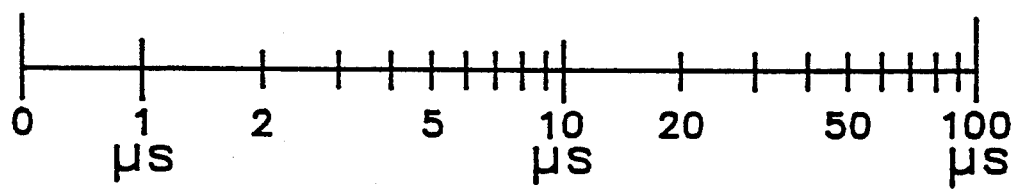

FIG. 8 illustrates a further expansion of ultra-wide time range display. The display in FIG. 8A includes two decades of time range while the display in FIG. 8B includes the time zero reference. In this illustration, the scaling factor for display between 0 and 1 is equal to the scaling factor for display between 1 and 2; to accomplish this display, information from time zero to the first decade of the logarithmic display is plotted in either a logarithmic or linear fashion. The standard logarithmic scale does not allow the time zero reference to be displayed but including the time zero reference can be significant in time domain measurements. The ultra-wide time range display not only allows display of an ultra-wide time range similar to a logarithmic scale, but also allows display of time zero information.

Figure 9A:
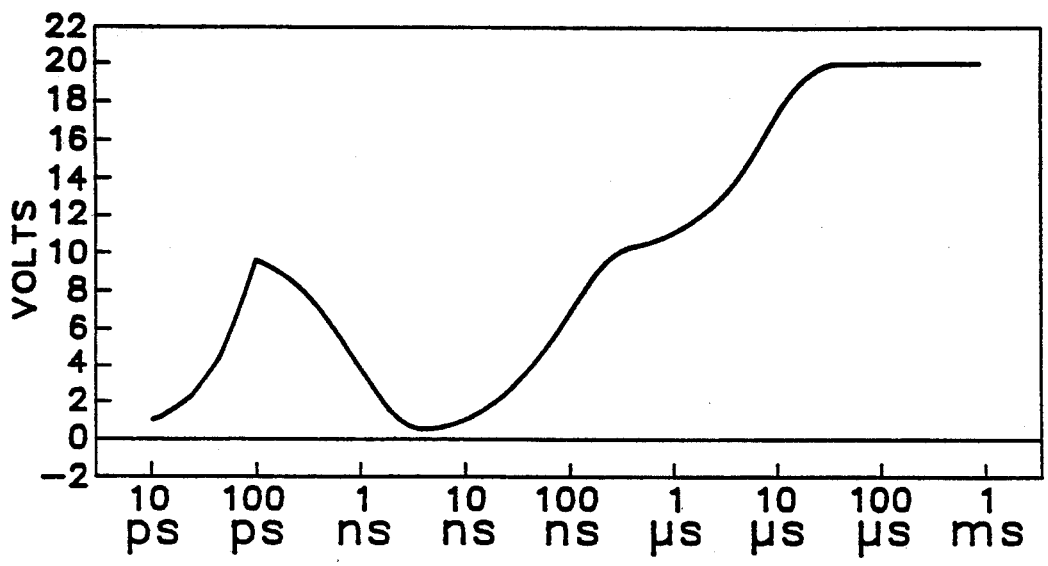
FIGS. 9A–9C are displays of waveforms illustrating the ultra-wide time range display with logarithmic and linear time scales and the manner in which waveforms may be displayed as though they were captured with any standard time base.
Figure 9B:
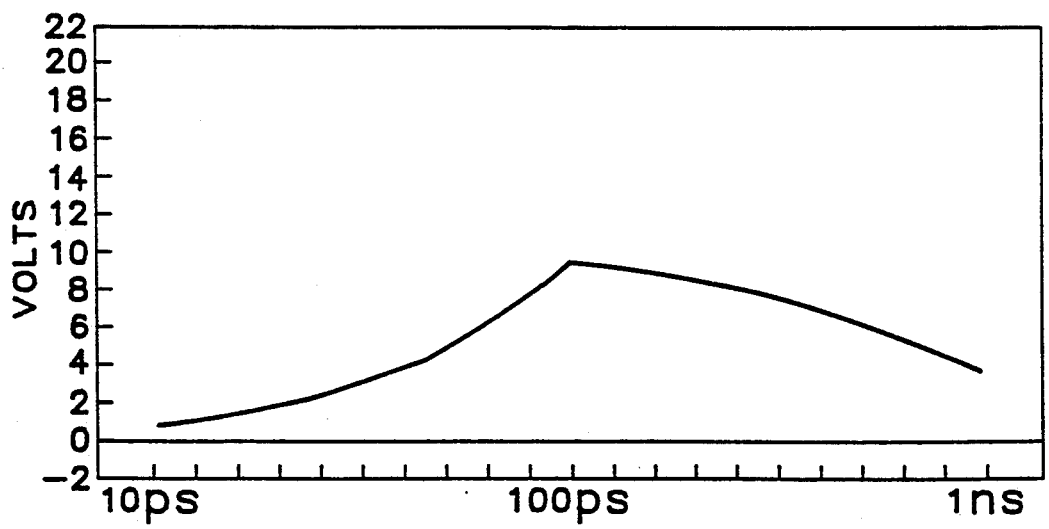
Figure 9C:
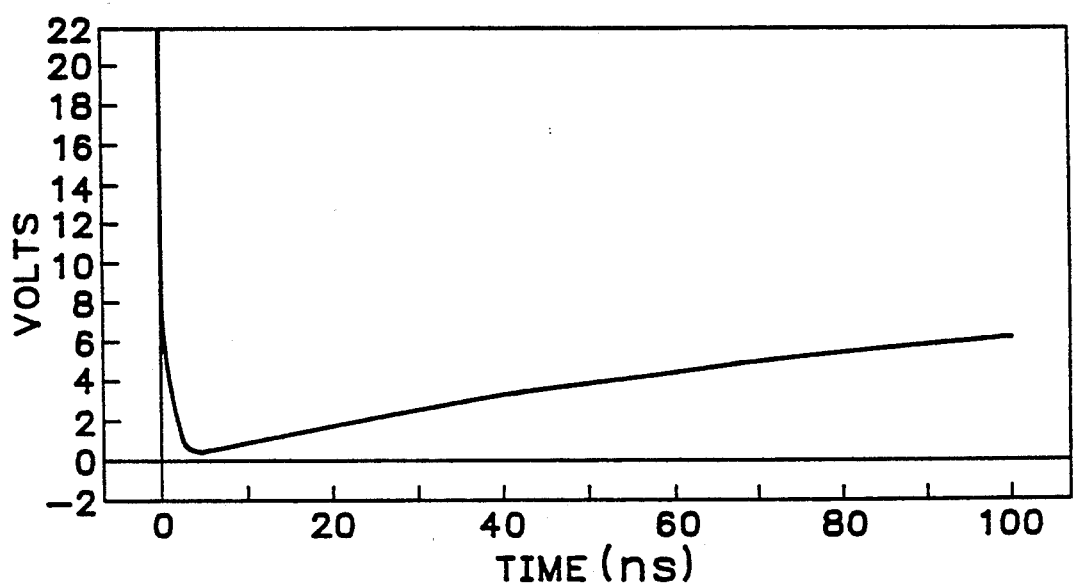

FIG. 9 illustrates how ultra-wide time range stored data can be retrieved and displayed. In FIG. 9A, a complete waveform is displayed on a logarithmic time scale from 10 picoseconds to 1 millisecond. FIG. 9B illustrates a portion of the same waveform, with the display times extending from 10 picoseconds to 1 nanosecond logarithmically. In FIG. 9C, the waveform is displayed from 0 to 100 nanoseconds on a linear time scale showing the lack of information.

Figure 10A:
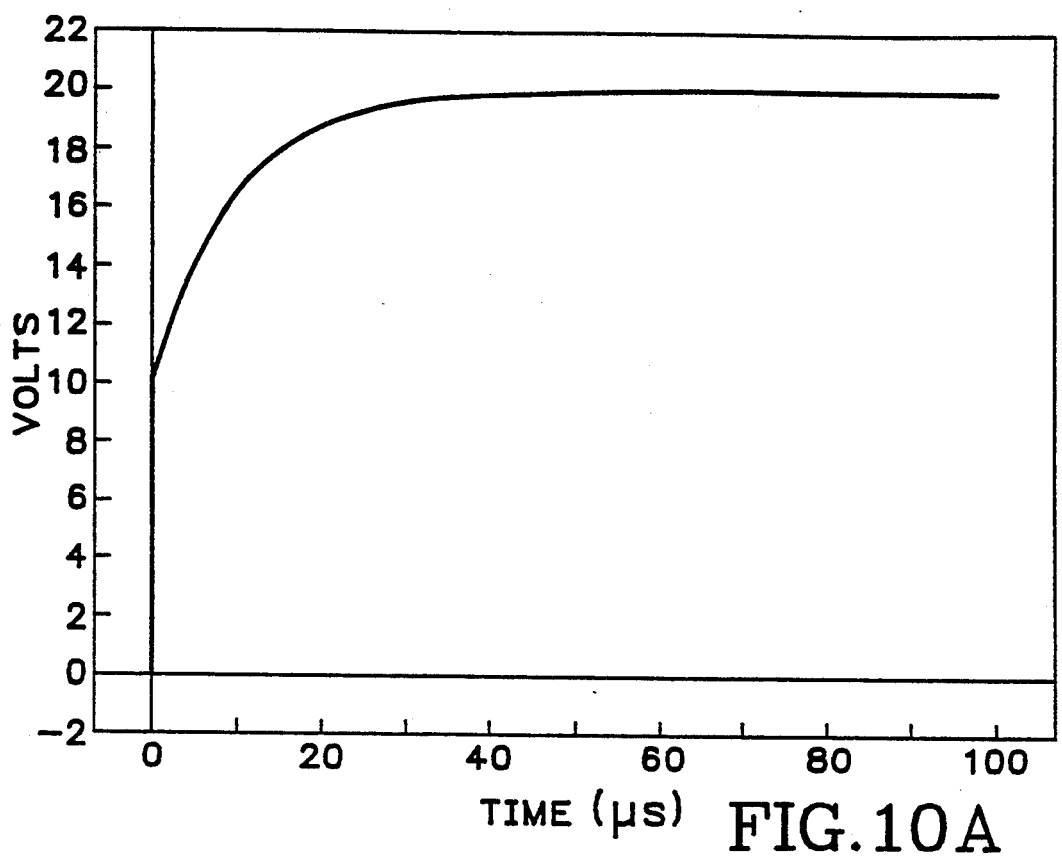
FIGS. 10A and 10B show time spectrum analysis according to the present invention.
Figure 10B:
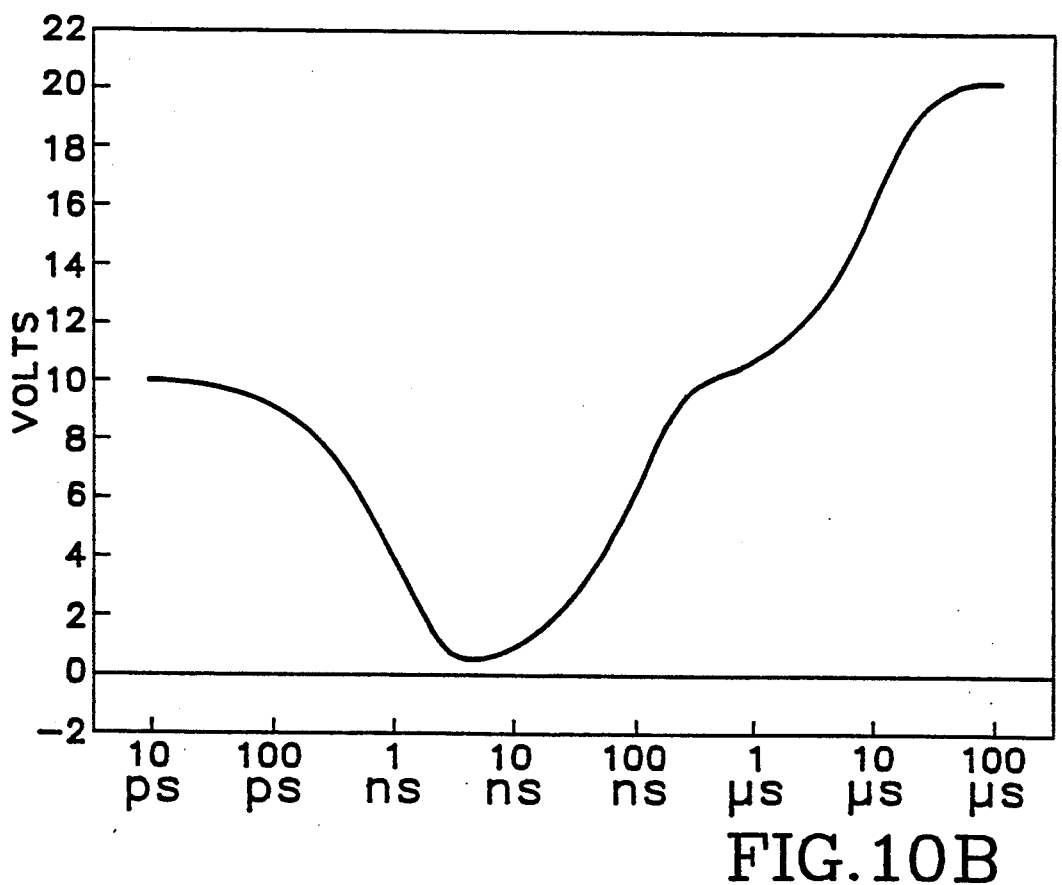

FIG. 10 illustrates time spectrum analysis according to the present invention. FIG. 10A represents an observed signal on a conventional linear time scale. FIG. 10B illustrates the same waveform on a wide range time scale (time spectrum domain or logarithmic time domain) which can display several decades of time window.

Figure 11A:
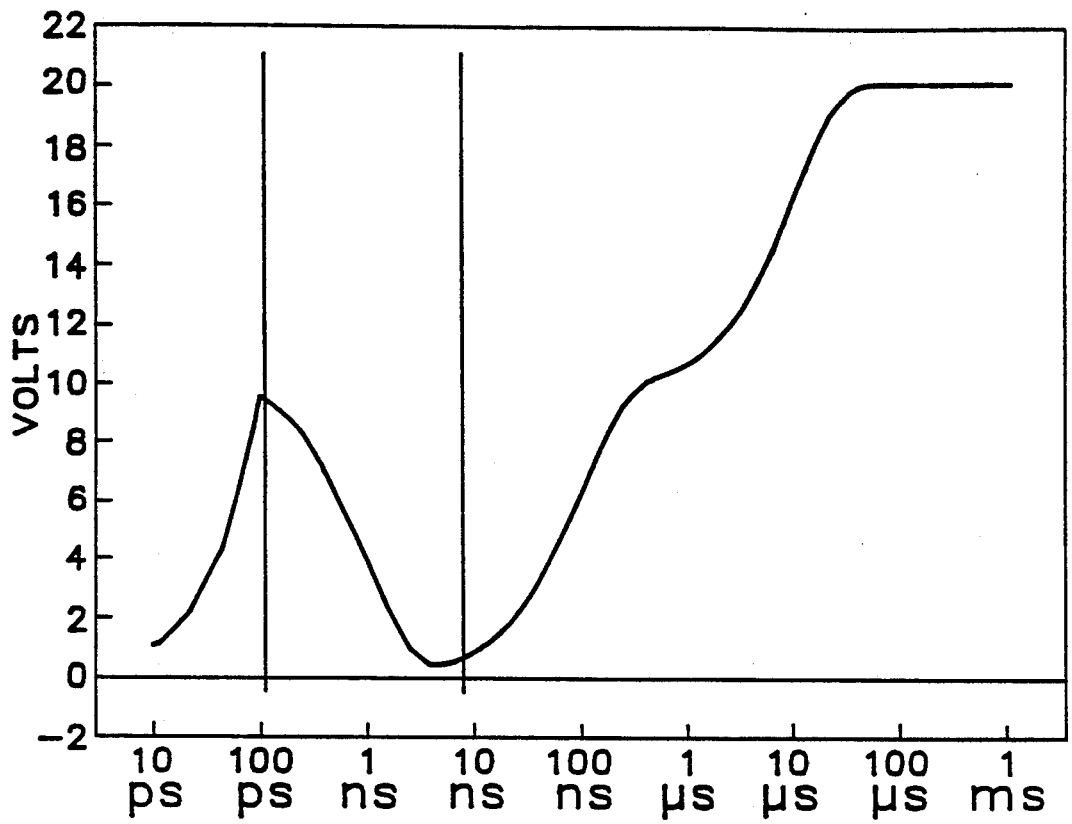
FIGS. 11A and 11B are illustrations of the use of cursors for expansion of a selected time range in the ultra-wide time range time base.
Figure 11B:
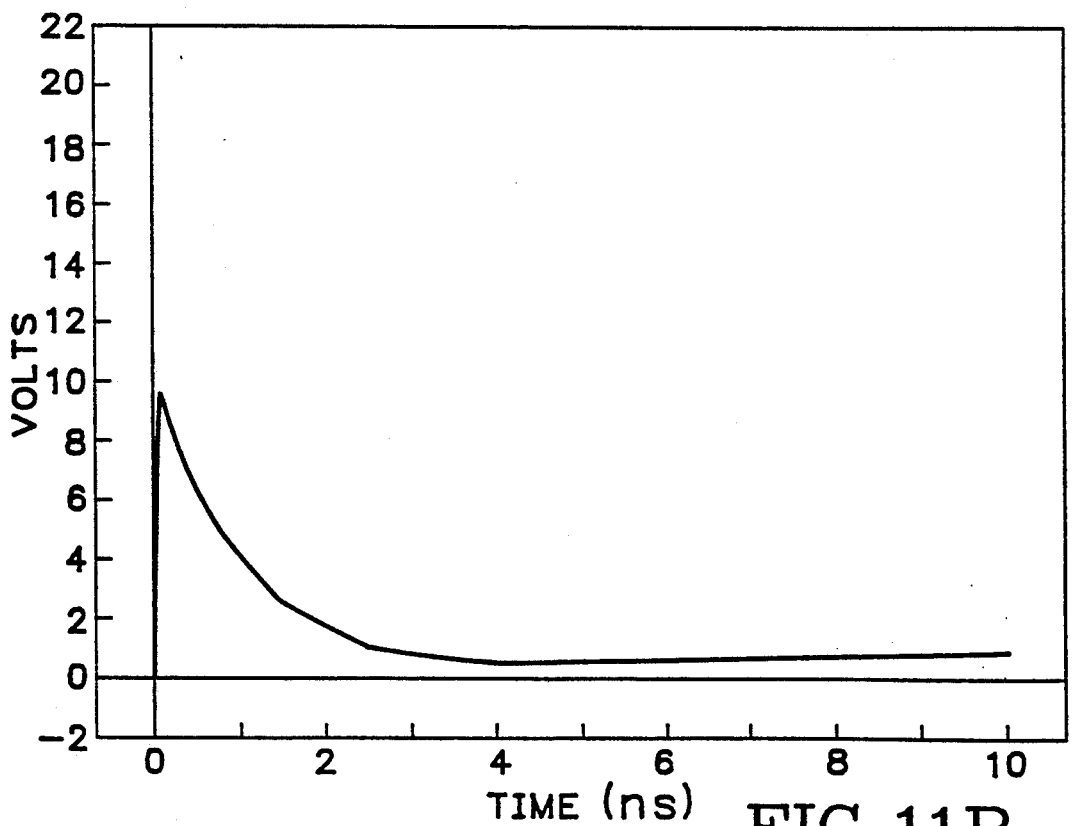

FIG. 11A illustrates two cursors indicating a selected time range of a digitizer utilizing an ultra-wide range time base. The time range employing a linear time base display is shown on FIG. 11B.

In addition to logarithmic or other non-linear time base compression, logarithmic or other non-linear signal compression means can be added to provide both vertical (amplitude) and time data compression. Vertical signal (amplitude) compression may be accomplished by dynamically altering signal attenuation/gain within the sample and hold means or within the A/D converter. In a particular embodiment, sample and hold circuit 21 of FIGS. 3, 4 and 5 includes input signal conditioning capability for performing logarithmic signal compression. This function may be accomplished through the inclusion of a logarithmic amplifier within the circuitry of the sample and hold.

Figure 17A:
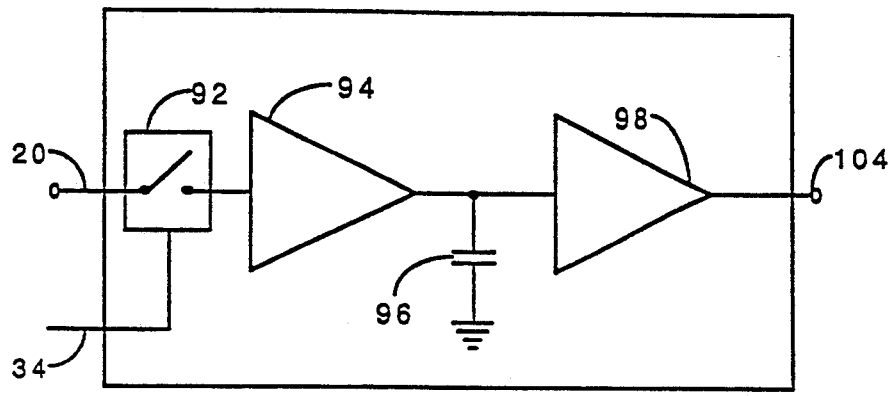
FIGS. 17A and 17B are more detailed diagrams of the sample and hold circuits of the present invention.
Figure 17B:
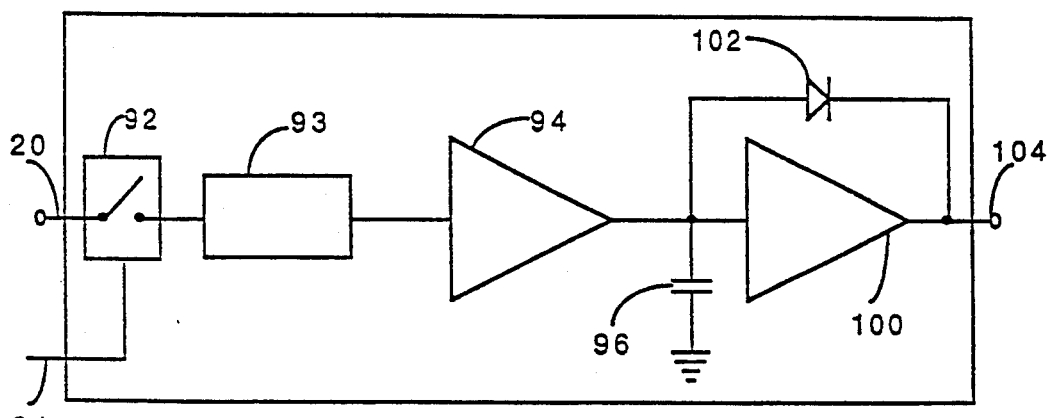

Referring to FIGS. 17A and 17B, more detailed diagrams of a sample and hold circuit and a sample and hold circuit with logarithmic amplitude compression, in a standard sample and hold circuit 21, as illustrated in FIG. 17A, input signal 20 is provided to a sampling amplifier 94 through sampling switch 92, with the output of amplifier 94 returned to ground through capacitor 96. The output of the sampling amplifier is also taken as input by amplifier 98 and the output thereof becomes the sample and hold output 104 as would be conveyed to A to D converter 44 of FIGS. 3, 4 and 5. In operation, an input signal 20 provided to sample and hold circuit 21 appears at the input of normally open sampling switch 92. When the sampling switch is closed (in response to a signal from the pulse control 34 of FIGS. 3, 4 and 5) the input signal as amplified by sampling amplifier 94 appears across capacitor 96. When the switch is opened, the signal value is retained as a charge on the capacitor and the amplifier 98 reads the charge and supplies the output signal 104 representative of the sampled input.

FIG. 17B illustrates a sample and hold circuit 121 with logarithmic amplitude compression. Input signal 20 is provided to a signal conditioner 93 through sampling switch 92. The output from the conditioner is conveyed to sampling amplifier 94 with the output of amplifier 94 returned to ground through capacitor 96. The output of the sampling amplifier is also taken as input by log amplifier 100 with the output thereof returned to the amplifier 100 input via feedback diode 102 having its cathode connected to the amplifier output and its anode connected to the amplifier input. Sample and hold circuit 121 operates in a manner similar to sample and hold circuit 21, with the difference that the logarithmic amplifier 100 provides a signal output that is logarithmically compressed relative to the sampled input.

Figure 12A:
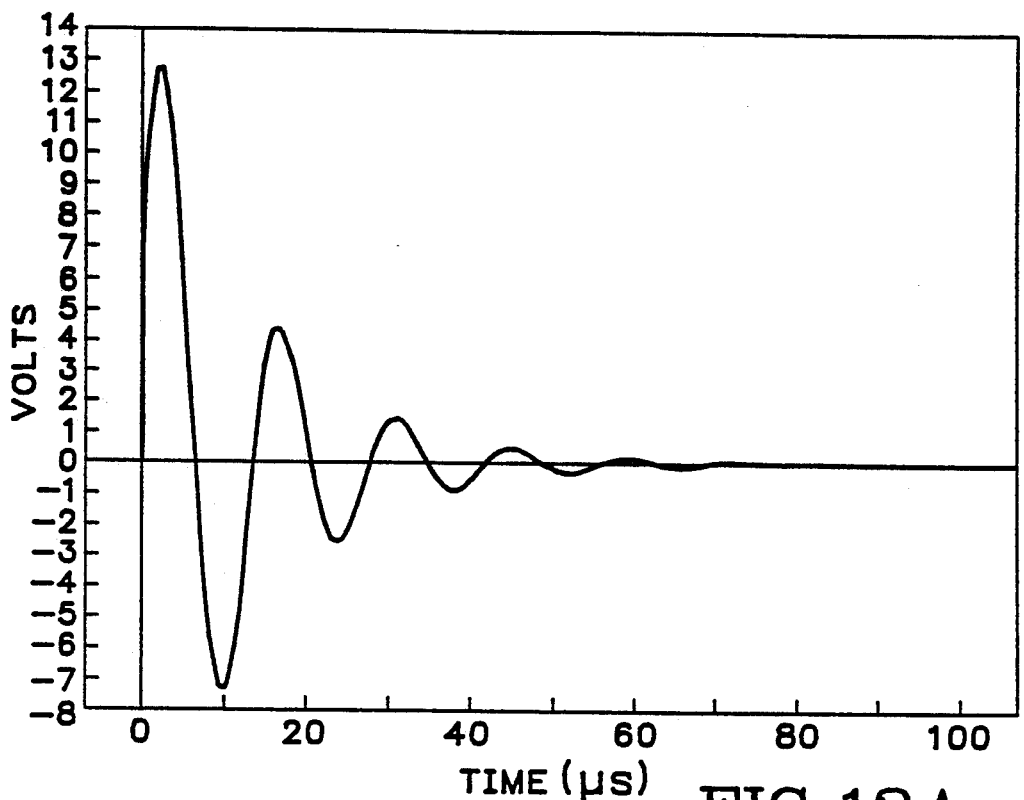
FIGS. 12A, 12B, 13A and 13B are illustrations of further modes of data compression by compression of the vertical signal.
Figure 12B:
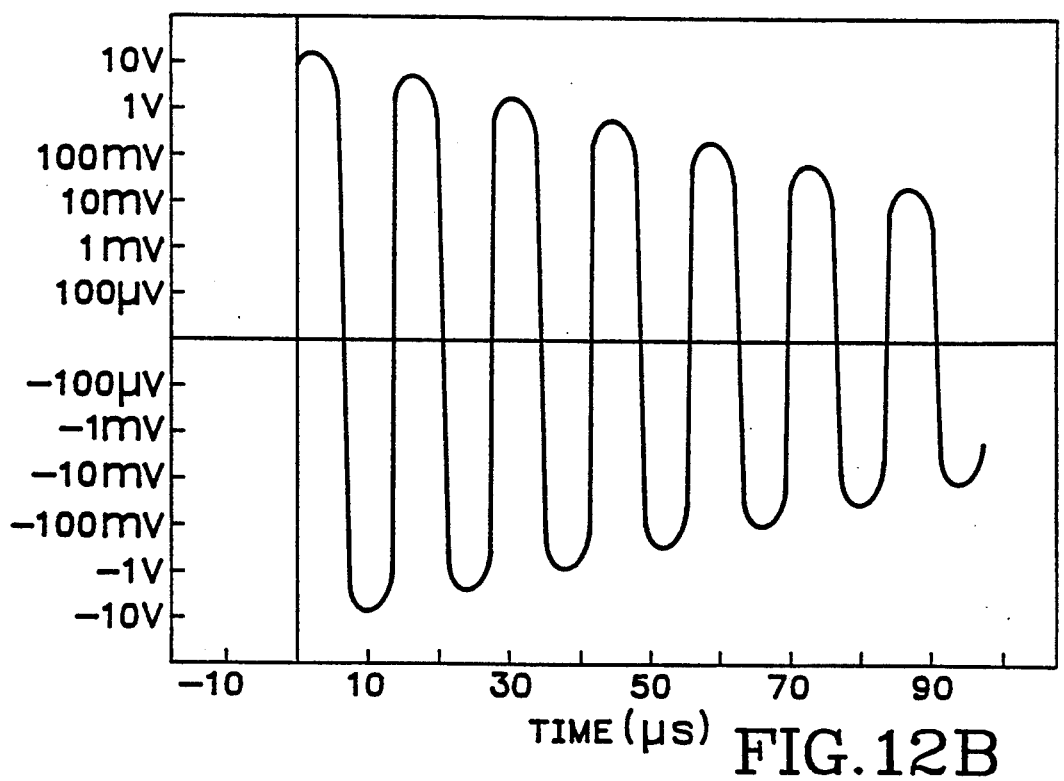

FIG. 12A is a graphic illustration of a damped sinusoid waveform acquired with the digitizer of the present invention as would be observed on display 2 of FIG. 3. Signal voltage vs. time is displayed, with a linear voltage amplitude display scale. With use of logarithmic signal compression of the sample and hold as discussed in conjunction with FIG. 17B, the display of FIG. 12B may be generated, wherein the signal voltage is displayed logarithmically. In this case, a minimum display range is selected, much as an attenuator setting would be chosen. The data of FIG. 12A is then normalized to the minimum setting, avoiding the problem of taking the logarithm of zero or a negative number. A display such as that shown in FIG. 12B can more clearly show the voltage at any instant of time on a logarithmic scale.

Figure 13A:
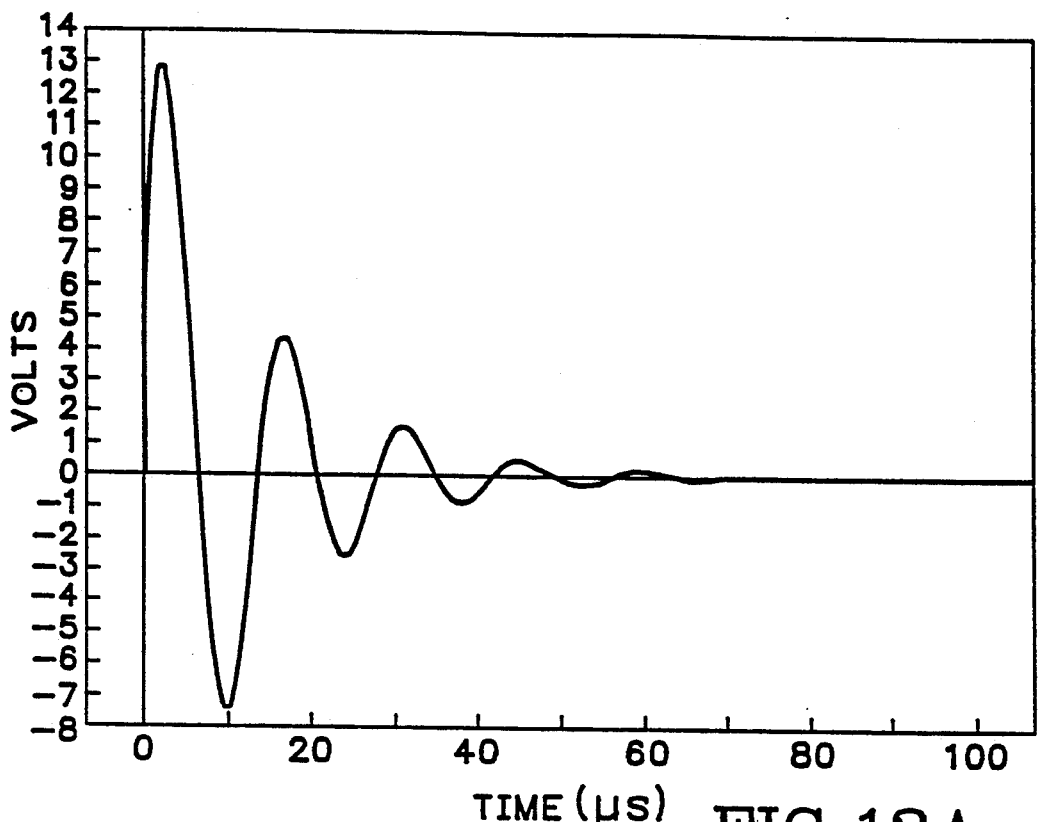
Figure 13B:
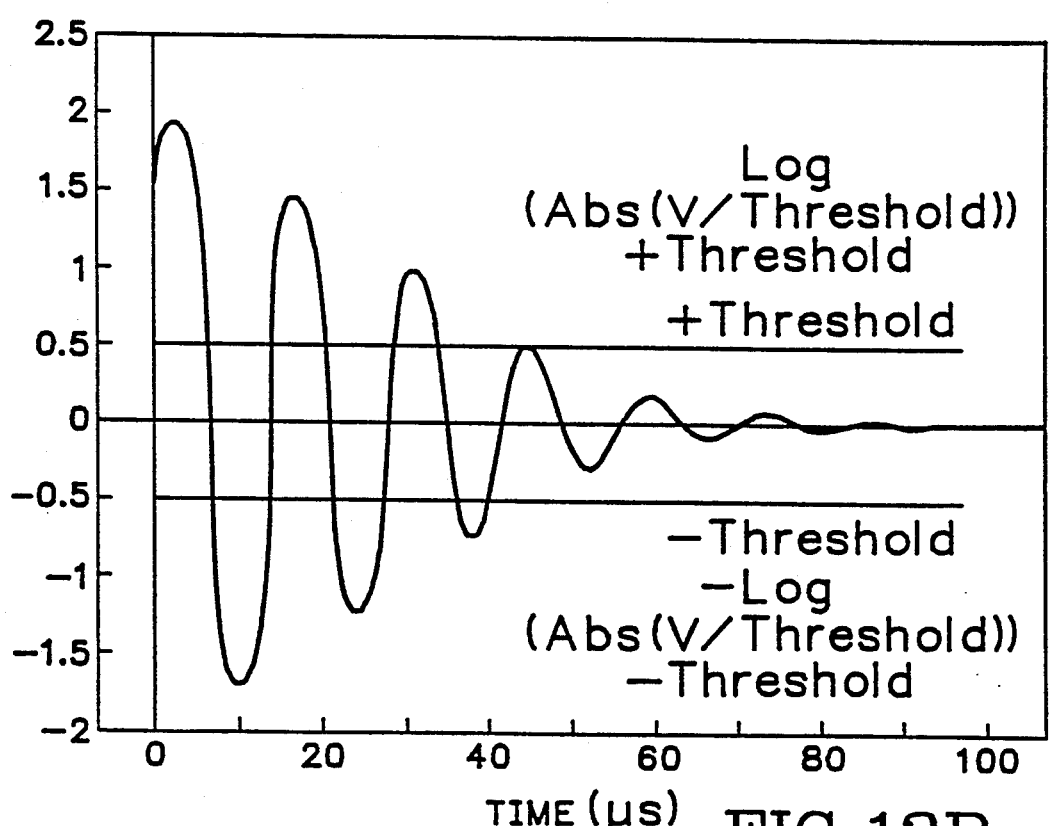

FIGS. 13A and 13B illustrate further ways of compressing the data by the introduction of a selectable threshold. Data acquired the absolute value of which is less than a threshold is stored unchanged. Data whose absolute value is above the selected threshold is compressed in a logarithmic manner and the threshold value added to it so that it can be displayed as shown. FIG. 13A shows the same damped sinusoid as in FIG. 12A, and FIG. 13B illustrates the display of the same data after logarithmic compression, with a threshold of +/− 0.5 volts. In the example illustrated in FIG. 13B, signal values above +0.5 volts or below −0.5 are displayed on a logarithmic voltage scale, in accordance with the following formulae. If the measured voltage is greater than +0.5 volts, then the displayed value is:

$Log(Abs(V/Threshold)) + Threshold$

If the measured voltage is less than −0.5 volts, then the displayed value is:

$-Log(Abs(V/Threshold)) - Threshold$ (where Abs denotes the absolute value function). Signal values between −0.5 volts and +0.5 volts are displayed as measured on a linear voltage scale. More generally, the voltage display is represented by:

$(Log(Abs(V/Threshold)) + Threshold)*(Sign\ of\ V)$

Figure 16A:
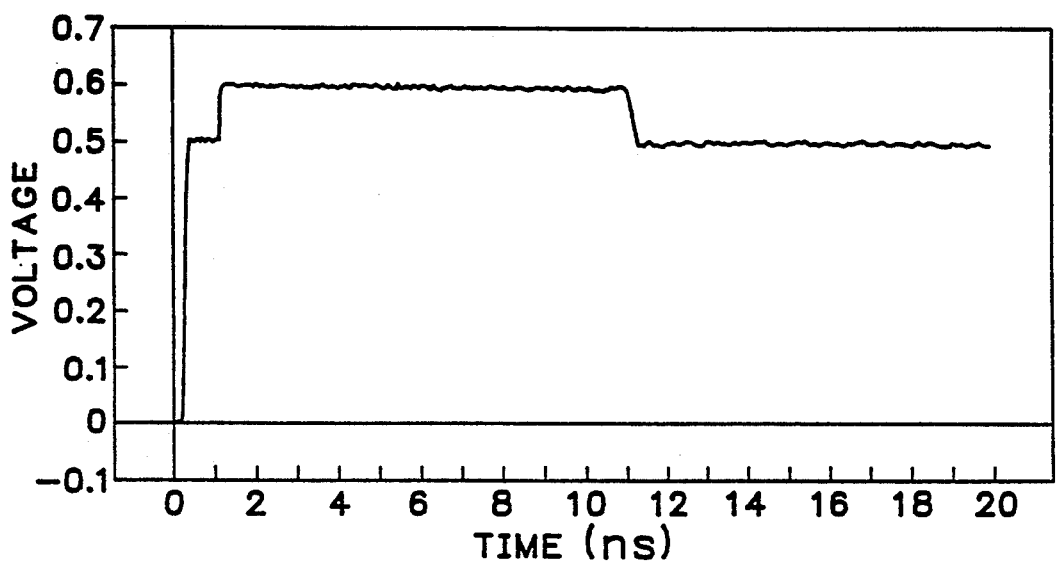
FIGS. 16A and 16B illustrate waveform displays as obtained in a conventional time domain reflectometer.
Figure 16B:
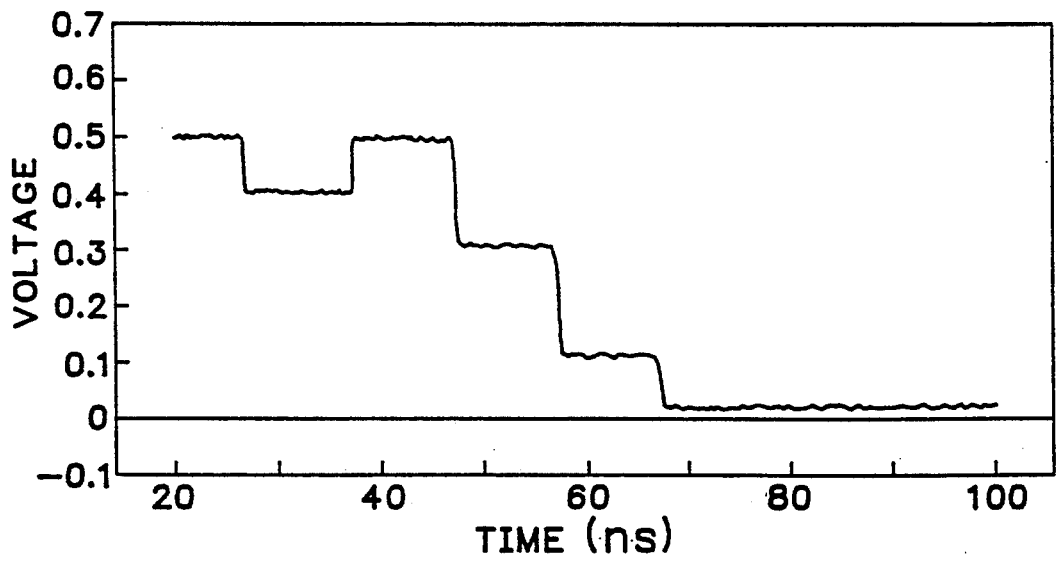
Figure 16C:
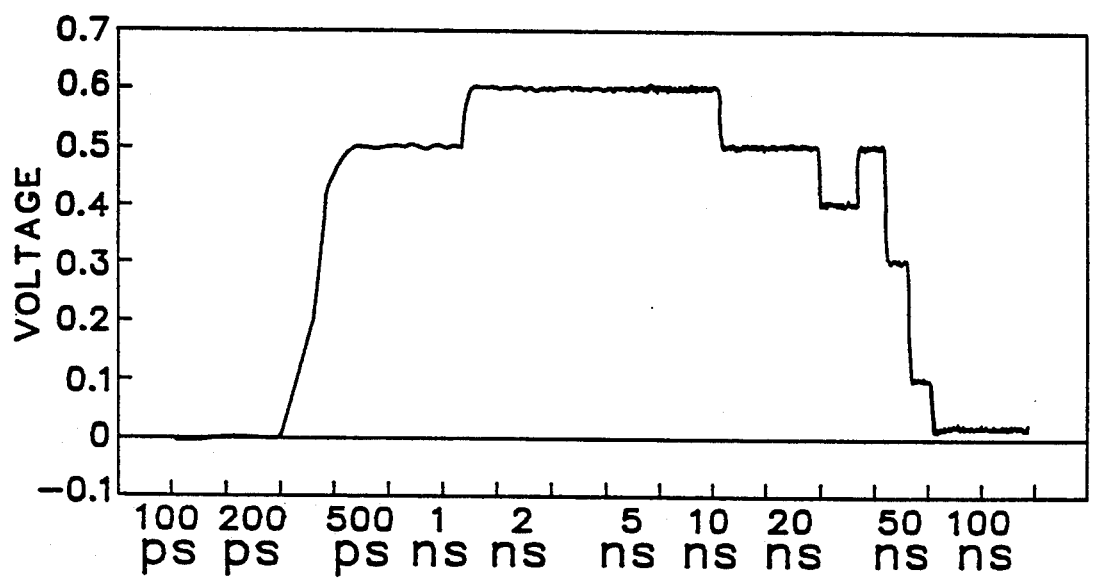
FIG. 16C illustrates a waveform display of the waveform of FIGS. 16A and 16B as displayed in the ultra-wide range time base in accordance with the present invention.

Example fields for use of the present invention include time domain reflectometry and component time response measurements. Time domain reflectometry may be accomplished by the embodiment of FIG. 5, with the device under test being replaced by a cable upon which the measurements are desired. FIGS. 16A and 16B illustrate the display of a waveform as acquired by a conventional time domain reflectometer. FIG. 16A displays the waveform linearly in time from zero to 20 nanoseconds. In FIG. 16B, the waveform is observed linearly in time from 20 nanoseconds to 100 nanoseconds. Referring to FIG. 16C, the advantage of the present invention as applied to time domain reflectometry may be observed; the waveforms of FIGS. 16A and 16B can be seen in greater detail, logarithmically in time from 100 picoseconds to 100 nanoseconds. Additional information can be obtained as to the signal behavior.

The present invention may be employed for measuring transient response of various types of electronic components including, but not limited to, capacitors, inductors and semiconductors. Even though these components are usually tested at low speeds, they often exhibit characteristics which can best be observed with very high speed time domain measurements. The present invention can capture both high and low speed phenomena without the need to change equipment settings.

Since the ultra-wide range time base is compatible with conventional sequential sampling acquisition systems, either for repetitive or single-shot systems, one skilled in the art can implement currently available modes such as multiple channels, word triggering, mixed sweeps, etc.

It will be appreciated that the invention is not restricted to the particular embodiment described, but that variations may be made therein without departing from the scope of the invention as defined in the appended claims.

I claim:

1. A signal acquisition system comprising:
   digitizing means for generating a digital representation of a sample of an incoming signal;
   timing control means for controlling operation of said digitizing means;
   means for dynamically varying the rate of operation of said timing control means for allowing variable data acquisition rates; and
   counter means for counting the number of samples acquired, said means for dynamically varying the rate of operation of said timing control means being operatively responsive to said counter means for varying the operation of said timing control means from a first predetermined timing sequence to a second predetermined timing sequence after a predetermined number of samples have been acquired in accordance with the first sequence, said predetermined number being greater than one.

2. A signal acquisition system according to claim 1 further comprising memory means for storing said digital representation.

3. A signal acquisition system comprising:
   digitizing means for generating a digital representation of a sample of an incoming signal;
   timing control means for controlling operation of said digitizing means; and
   means for varying the rate of operation of said timing control means for allowing variable data acquisition rates,
   wherein said digitizing means further comprises data value change detection means for comparing the data change rate of said signal and for capturing data other than during a time period when the data change rate is within a prescribed value.

4. A signal acquisition system comprising:
   digitizing means for generating a digital representation of a sample of an incoming signal;
   timing control means for controlling operation of said digitizing means;
   means for varying the rate of operation of said timing control means for allowing variable data acquisition rates; and
   stimulus means for providing a drive signal, said drive signal having a precise time correlation with the operation of the timing control means.

5. A signal acquisition system comprising:
   digitizing means for generating a digital representation of a sample of an incoming signal;
   timing control means for controlling operation of said digitizing means;
   means for varying the rate of operation of said timing control means for allowing variable data acquisition rates; and
   signal compression means to compress the signal in accordance with a logarithmic function.

6. A signal acquisition system which allows capturing of very fast time varying events and slow time varying events in a compressed contiguous data format, comprising:
   digitizing means for creating a digital representation of a sample of a conditioned input signal;
   memory means for storing said digital representation; and
   time base means comprising a trigger, a clock and a dynamically alterable sampling rate controller for dynamically changing the sampling rate of said digitizing means after a predetermined number of said digital representations have been created, said predetermined number being greater than one.

7. A signal acquisition system according to claim 6 further comprising counter means for counting the number of samples acquired, said time base means being operatively responsive to said counter means, said memory means storing said digital representation at an address responsive to said counter means.

8. A signal acquisition system which allows capturing of very fast time varying events and slow time varying events in a compressed contiguous data format, comprising:
   digitizing means for creating a digital representation of a sample of a conditioned input signal;
   memory means for storing said digital representation; and time base means comprising a trigger, a clock and a dynamically alterable sampling rate controller which is capable of changing the sampling rate, wherein said digitizing means further comprises data value change detection means for comparing the data change rate of an input signal and for capturing data other than during a time period when the data change rate is within a prescribed value.

9. A signal acquisition system which allows capturing of very fast time varying events and slow time varying events in a compressed contiguous data format, comprising:
digitizing means for creating a digital representation of a sample of a conditioned input signal;
memory means for storing said digital representation;
time base means comprising a trigger, a clock and a dynamically alterable sampling rate controller which is capable of changing the sampling rate; and
stimulus means for providing a drive signal, said drive signal having a precise time correlation to the operation of the time base means.

10. A signal acquisition system which allows capturing of very fast time varying events and slow time varying events in a compressed contiguous data format, comprising:
digitizing means for creating a digital representation of a sample of a conditioned input signal;
memory means for storing said digital representation;
time base means comprising a trigger, a clock and a dynamically alterable sampling rate controller for dynamically changing the sampling rate of said digitizing mans after a predetermined number of said digital representations have been created said predetermined number being greater than one;
display means;
data processing means; and
bus means for interfacing said signal acquisition system with said display means and said data processing means to allow data to be displayed or processed.

11. A time domain reflectometer comprising:
digitizing means for generating a plurality of digital representations of samples of an incoming signal from a device under test;
timing control means for controlling operation of said digitizing means;
means for dynamically varying the rate of operation of said timing control means for allowing variable data acquisition rates for digitizing a first group of said plurality of digital representations at a first predetermined data acquisition spacing with respect to time and for digitizing a second group of said plurality of digital representations at a second predetermined data acquisition spacing with respect to time; and
stimulus means providing a drive signal for a device under test wherein said stimulus means has a precise time correlation or coherence with the operational start of said timing control means.

12. A time domain reflectometer comprising:
digitizing means for generating a digital representation of a sample of an incoming signal from a device under test;
timing control means for controlling operation of said digitizing means;
means for varying the rate of operation of said timing control means or allowing variable data acquisition rates;
stimulus means providing a drive signal for a device under test wherein said stimulus means has a precise time correlation or coherence with the operational start of said timing control means; and
timing control delay means for providing a prescribed time delay between operation of said stimulus means and the operation of said digitizing means.

13. A time domain reflectometer in accordance with claim 11 further comprising memory means for storing said plurality of digital representations.

14. A time domain reflectometer in accordance with claim 11 wherein digital representations of said first group of equally spaced with respect to time.

15. A time domain reflectometer in accordance with claim 11 wherein digital representations of said first group are non-linearly spaced with respect to time.

16. A signal acquisition system which allows capturing signals containing both rapidly varying and slowly varying components in a compressed contiguous data format, comprising:
digitizing means for generating a digital representation of a sample of a signal;
memory means for storing digitized data from said digitizing means;
time base means for generating a trigger synchronized to the signal;
generator means for generating a group of sampling pulses which have prescribed time relationships with the trigger wherein said digitizing means is operatively responsive to said sampling pulses; and
means for dynamically altering the frequency of a group of sampling pulses in a predetermined manner from a first set of time relationships to a second set of time relationships after at least two digital representations have been generated in accordance with the first set of time relationships.

17. A method of acquiring a signal with an ultra-wide range digitizer comprising the steps of:
generating a digital representation of a sample of the signal;
repeating said generating step at timed intervals; and
dynamically varying the intervals in a predetermined manner after at least two digital representations have been generated to provide a first plurality of digital representations generated at a first set of timed intervals and a second plurality of digital representations generated at a second set of timed intervals.

18. A method of acquiring a signal with an ultra-wide range digitizer comprising the steps of:
generating a digital representation of a sample of the signal;
storing said digital representation and a representation of the time at which said step of generating a digital representation of a sample of the signal occurred;
repeating said generating and storing steps at timed intervals; and
varying the intervals in a predetermined manner from a first interval time to a second interval time after at least two digital representations have been generated.

19. A method of acquiring a signal with an ultra-wide range digitizer comprising the steps of:
generating a digital representation of a sample of the signal;
storing said digital representation;

repeating said generating and storing steps at timed intervals;

varying the intervals in a predetermined manner from a first interval time to a second interval time after at least two digital representations have been generated; and reconstructing the time at which a signal sample was taken based on the relative storage position of said digital representation.

* * * * *